United States Patent
Li et al.

(10) Patent No.: US 9,647,630 B2
(45) Date of Patent: May 9, 2017

(54) ANTENNA IMPEDANCE MATCHING APPARATUS, SEMICONDUCTOR CHIP, AND METHOD

(71) Applicant: Huawei Technologies Co., Ltd., Shenzhen, Guangdong (CN)

(72) Inventors: Weinan Li, Shanghai (CN); Tao Liu, Shanghai (CN); Jian Liang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 137 days.

(21) Appl. No.: 14/310,603

(22) Filed: Jun. 20, 2014

(65) Prior Publication Data
US 2014/0375523 A1   Dec. 25, 2014

(30) Foreign Application Priority Data
Jun. 25, 2013   (CN) .......................... 2013 1 0256650

(51) Int. Cl.
*H03H 11/28*   (2006.01)
*H03H 7/38*    (2006.01)
(Continued)

(52) U.S. Cl.
CPC ............ *H03H 7/383* (2013.01); *H01Q 1/242* (2013.01); *H01Q 1/50* (2013.01); *H03H 7/38* (2013.01); *H03H 2007/386* (2013.01)

(58) Field of Classification Search
CPC   H03H 7/38; H03H 7/383; H01Q 1/50; H01Q 1/242
(Continued)

(56) References Cited

U.S. PATENT DOCUMENTS 6,681,102 B1 * 1/2004 Collier ...................... H03J 3/08
                                                  331/177 R
8,294,632 B2   10/2012 Skarp
(Continued)

FOREIGN PATENT DOCUMENTS

CN          1630134 A     6/2005
CN        101728642 A     6/2010
(Continued)

OTHER PUBLICATIONS

Franco et al., "Broadband Reconfigurable Matching Network of Reduced Dimensions for the UHF Military Satellite Communication Band," IEEE MTT-S International Microwave Symposium Digest (MTT), Baltimore, Maryland, Institute of Electrical and Electronics Engineers, New York, New York (Jun. 5-10, 2011).

*Primary Examiner* — Dameon E Levi
*Assistant Examiner* — Ab Salam Alkassim, Jr.
(74) *Attorney, Agent, or Firm* — Leydig, Voit & Mayer, Ltd.

(57) ABSTRACT

The present invention provides an antenna impedance matching apparatus, semiconductor chip, and method. The apparatus includes: a semiconductor chip, including multiple adjustable capacitors and multiple switches; and at least one impedance component, located outside the semiconductor chip, where the semiconductor chip is coupled to the at least one impedance component through multiple terminals and coupled to an input terminal and an output terminal of the antenna impedance matching apparatus, the input terminal and the output terminal of the antenna impedance matching apparatus are respectively coupled to a radio frequency circuit and an antenna, the multiple switches are configured to, under control of a control signal, switch a connection between the multiple adjustable capacitors and the at least one impedance component, and values of the
(Continued)

multiple adjustable capacitors are adjusted by an adjustment signal, so as to tune impedance matching of the antenna.

20 Claims, 5 Drawing Sheets

(51) Int. Cl.
  *H01Q 1/24* (2006.01)
  *H01Q 1/50* (2006.01)
(58) Field of Classification Search
  USPC .......................................... 343/861; 333/32
  See application file for complete search history.

(56) References Cited

U.S. PATENT DOCUMENTS

| | | | |
|---|---|---|---|
| 2005/0128152 A1 | 6/2005 | Milosavljevic | |
| 2006/0284754 A1* | 12/2006 | Garrity | H03M 1/1225 341/172 |
| 2007/0018731 A1* | 1/2007 | Casenave | H03B 5/368 331/1 A |
| 2007/0103248 A1* | 5/2007 | Nakamura | H03D 3/007 331/167 |
| 2009/0153261 A1* | 6/2009 | Rofougaran | H01L 23/49822 333/33 |
| 2009/0265042 A1* | 10/2009 | Mollenkopf | H02J 3/12 700/298 |
| 2009/0267703 A1* | 10/2009 | May | H03H 7/40 333/32 |
| 2010/0124890 A1 | 5/2010 | Schwarzmueller et al. | |
| 2011/0227666 A1* | 9/2011 | Manssen | H03H 5/12 333/32 |
| 2012/0146865 A1 | 6/2012 | Hayashi et al. | |
| 2013/0063223 A1* | 3/2013 | See | H03H 7/38 333/32 |
| 2013/0257558 A1* | 10/2013 | Kim | H03H 11/28 333/32 |
| 2013/0316663 A1* | 11/2013 | Kishigami | H03H 7/40 455/78 |
| 2013/0331042 A1* | 12/2013 | See | H04B 17/12 455/77 |

FOREIGN PATENT DOCUMENTS

| | | |
|---|---|---|
| CN | 102696149 A | 9/2012 |
| EP | 2651032 A2 | 10/2013 |
| EP | 2672629 A1 | 12/2013 |
| JP | 2008258186 A | 10/2008 |
| WO | WO 2012104972 A1 | 8/2012 |

* cited by examiner

ANTENNA IMPEDANCE MATCHING APPARATUS, SEMICONDUCTOR CHIP, AND METHOD

CROSS-REFERENCE TO RELATED APPLICATIONS

This application claims priority to Chinese Patent Application No. 201310256650.8, filed on Jun. 25, 2013, which is hereby incorporated by reference in its entirety.

TECHNICAL FIELD

The present invention relates to the field of communications technologies, and in particular, to an antenna impedance matching apparatus, semiconductor chip, and method.

BACKGROUND

Antenna impedance of a user equipment is easily affected by an external environment. For example, when a user holds a user equipment in the user's hand, or places the user equipment near the head of the user, or places the user equipment into a pocket, all such common actions may cause a significant change in the antenna impedance. For a radio frequency transceiver system, when an impedance mismatch occurs on an antenna port, communication performance deteriorates. For example, efficiency of a power amplifier is reduced, causing a decrease in transmit power and an increase in overall power consumption, and a noise coefficient of a receiver deteriorates, causing a decrease in sensitivity. In addition, with deployment of an LTE system, a user equipment needs to support an increasingly wide frequency range, and it is difficult to improve efficiency of a broadband antenna without increasing an antenna size of a handset, thereby causing a decrease in the communication performance.

An antenna impedance matching (Antenna Impedance Matching) apparatus, for example, an antenna tuner (Antenna Tuner), is a component used for tuning antenna impedance and is disposed at a feedback port of an antenna. On the one hand, the antenna tuner can reduce an impact of a change in the antenna impedance on performance of a radio frequency transceiver, increase airtime of the handset, and improve communication quality. On the other hand, for a broadband antenna, the antenna tuner can further tune the antenna impedance to improve efficiency of the antenna in an operating frequency band, thereby improving the communication quality.

In an existing solution, the antenna tuner may be implemented by combining multiple adjustable capacitor chips and fixed inductors outside the chips, where each adjustable capacitor chip may switch between different capacitance values by using multiple fixed capacitors and multiple switches. The antenna tuner may be implemented by using multiple adjustable capacitor chips in combination with multiple surface-mount inductor/capacitor components outside the chips. However, the antenna tuner is tunable within a narrowband frequency range, and can perform optimization only on a specific frequency band, and therefore, cannot flexibly tune impedance matching of an antenna according to a requirement.

In an antenna tuner that uses multiple semiconductor chips that have independent adjustable capacitors, an impedance matching network of the antenna tuner has a fixed structure after adjusting is completed. For different user equipments, a new antenna tuner needs to be redesigned and adjusted according to antenna characteristics of the user equipments, so that a development cycle is extended. In addition, because the antenna tuner needs to be implemented by using multiple semiconductor chips that have independent adjustable capacitors, a cost is high, and a large PCB area is occupied.

The antenna tuner may be formed by integrating multiple semiconductor chips that have independent adjustable capacitors into one semiconductor chip that has multiple adjustable capacitors, so as to reduce the cost and decrease the PCB area. However, such a structure of the impedance matching network is still fixed. For different user equipments, external components of the semiconductor chips of the antenna tuner still need to be redesigned and adjusted according to the antenna characteristics, so that a development cycle is extended. In addition, the fixed structure of the impedance matching network causes a limited frequency tuning range. To cover a broadband frequency range, external fixed capacitor/inductor components of the semiconductor chips must be replaced, and therefore, such an antenna tuner cannot meet requirements of a full-frequency band broadband system.

Moreover, the semiconductor chip with adjustable capacitors and the external capacitor/inductor components may further be encapsulated into one component, thereby decreasing the PCB area and reducing the cost. However, a topology of the impedance matching network and inductance values of the inductor components are fixed, and therefore, such a component is only used for a specific handset platform or a usage frequency band, but cannot be used as a general component. In addition, only a narrowband frequency range can be covered, and the requirements of the full-frequency band broadband system cannot be met.

Because a fixed topology network can obtain optimal performance only with adjusting and optimization according to the antenna characteristics, and an inductance value of an off-chip inductor or capacitor component is fixed and non-adjustable, the frequency range of the foregoing impedance matching network cannot meet the requirements of the full-frequency band broadband system.

SUMMARY

Embodiments of the present invention provide an antenna impedance matching apparatus, semiconductor chip, and method, which can expand frequency coverage, thereby flexibly tuning antenna impedance according to a requirement.

According to a first aspect, an antenna impedance matching apparatus is provided and includes: a semiconductor chip, including multiple adjustable capacitors and multiple switches; and at least one impedance component, located outside the semiconductor chip, where the semiconductor chip is coupled to the at least one impedance component through multiple terminals and coupled to an input terminal and an output terminal of the antenna impedance matching apparatus, the input terminal and the output terminal of the antenna impedance matching apparatus are respectively coupled to a radio frequency circuit and an antenna, the multiple switches, are configured to, under control of a control signal, switch a connection between the multiple adjustable capacitors and the at least one impedance component, and values of the multiple adjustable capacitors are adjusted by an adjustment signal, so as to tune impedance matching of the antenna.

With reference to the first aspect, in a first possible implementation manner, the multiple switches are configured to: when the multiple switches are in an open state or a closed state, perform at least one of the following connections on the multiple adjustable capacitors and the at least one impedance component: parallel connection, series connection, and bypassing, so as to tune the impedance matching of the antenna.

With reference to the first possible implementation manner, in a second possible implementation manner, the semiconductor chip includes a control circuit, configured to generate the control signal and the adjustment signal. One terminal of at least one switch in the multiple switches and one terminal of at least one adjustable capacitor in the multiple adjustable capacitors are connected to a same terminal of the semiconductor chip, and the other terminal of the at least one switch in the multiple switches and the other terminal of the at least one adjustable capacitor in the multiple adjustable capacitors are respectively connected to other terminals of the semiconductor chip.

With reference to the first aspect and any one of the foregoing possible implementation manners, in a third possible implementation manner, the multiple adjustable capacitors include a first adjustable capacitor and a second adjustable capacitor, and the multiple switches include a first switch and a second switch, where a first terminal and a second terminal of the first adjustable capacitor are respectively connected to a first terminal and a second terminal of the semiconductor chip, a first terminal and a second terminal of the second adjustable capacitor are respectively connected to a fourth terminal and a fifth terminal of the semiconductor chip, a first terminal and a second terminal of the first switch are respectively connected to the first terminal and a third terminal of the semiconductor chip, and a first terminal and a second terminal of the second switch are respectively connected to the fourth terminal and a sixth terminal of the semiconductor chip.

With reference to the third possible implementation manner, in a fourth possible implementation manner, the at least one impedance component includes: a first inductor, a second inductor, a first capacitor, and a second capacitor, where the antenna impedance matching apparatus is an L-type impedance matching network, the first adjustable capacitor is connected to the input terminal of the antenna impedance matching apparatus through the first terminal of the semiconductor chip and the first inductor, the first adjustable capacitor is connected to the output terminal of the antenna impedance matching apparatus through the second terminal of the semiconductor chip, the second adjustable capacitor is connected to the output terminal of the antenna impedance matching apparatus through the fourth terminal of the semiconductor chip and is grounded through the fifth terminal of the semiconductor chip, the output terminal of the antenna impedance matching apparatus is grounded through the second inductor, the first switch is connected to the output terminal of the antenna impedance matching apparatus through the third terminal of the semiconductor chip and the first capacitor, so that the first adjustable capacitor is connected in parallel to the first capacitor when the first switch is closed, and the second switch is grounded through the sixth terminal of the semiconductor chip and the second capacitor, so that the second adjustable capacitor is connected in parallel to the second capacitor when the second switch is closed.

With reference to the third possible implementation manner, in a sixth possible implementation manner, the at least one adjustable capacitor further includes a third adjustable capacitor, the multiple switches further include a third switch, a first terminal and a second terminal of the third adjustable capacitor are respectively connected to a seventh terminal and an eighth terminal of the semiconductor chip, and a first terminal and a second terminal of the third switch are respectively connected to the seventh terminal and a ninth terminal of the semiconductor chip.

With reference to the sixth possible implementation manner, in a seventh possible implementation manner, the impedance matching apparatus is a PI-type impedance matching network, and the at least one impedance component includes: a second inductor, a third inductor, and a fourth inductor, where the first adjustable capacitor is connected to the input terminal of the antenna impedance matching apparatus through the first terminal of the semiconductor chip and is grounded by using the second terminal of the semiconductor chip, the second adjustable capacitor is connected to the input terminal of the antenna impedance matching apparatus by using the fourth terminal of the semiconductor chip and the fourth inductor and is connected to the output terminal of the antenna impedance matching apparatus by using the fifth terminal of the semiconductor chip, the third adjustable capacitor is connected to the output terminal of the antenna impedance matching apparatus through the seventh terminal of the semiconductor chip and is grounded through the eighth terminal, the input terminal of the antenna impedance matching apparatus is grounded by using the third inductor, and the output terminal of the antenna impedance matching apparatus is grounded by using the second inductor.

With reference to the seventh possible implementation manner, in an eighth possible implementation manner, the at least one impedance component further includes: a fifth inductor, a sixth inductor, and a seventh inductor, where the first switch is grounded by using the third terminal of the semiconductor chip and the fifth inductor, so that the third inductor is connected in parallel to the fifth inductor, the second switch is connected in series to the sixth inductor by using the sixth terminal of the semiconductor chip, so that the fourth inductor is connected in parallel to the sixth inductor, and the third switch is grounded by using the ninth terminal of the semiconductor chip and the seventh inductor, so that the second inductor is connected in parallel to the seventh inductor.

With reference to the sixth possible implementation manner, in a ninth possible implementation manner, the impedance matching apparatus is a PI-type impedance matching network, and the at least one impedance component includes: a second inductor, a third inductor, and a fourth inductor, where the first adjustable capacitor is connected to the input terminal of the antenna impedance matching apparatus through the first terminal of the semiconductor chip and is grounded by using the second terminal of the semiconductor chip, the second adjustable capacitor is connected to the input terminal of the antenna impedance matching apparatus by using the fourth terminal of the semiconductor chip and is connected to the output terminal of the antenna impedance matching apparatus by using the fifth terminal of the semiconductor chip and the fourth inductor, the third adjustable capacitor is connected to the output terminal of the antenna impedance matching apparatus by using the seventh terminal of the semiconductor chip and is grounded by using the eighth terminal, the input terminal of the antenna impedance matching apparatus is grounded by using the third inductor, and the output terminal of the antenna impedance matching apparatus is grounded by using the second inductor.

With reference to the sixth possible implementation manner, in a ninth possible implementation manner, the at least one impedance component further includes a fourth inductor, the antenna impedance matching apparatus is an LC-type impedance matching network, and one of the multiple adjustable capacitors and the fourth inductor are connected in series between the output terminal and the input terminal of the antenna impedance matching apparatus.

With reference to the tenth possible implementation manner, in an eleventh possible implementation manner, the at least one impedance component further includes: a fifth inductor and a third capacitor, where the first adjustable capacitor is connected to the input terminal of the antenna impedance matching apparatus through the first terminal of the semiconductor chip and the fourth inductor and is grounded by using the second terminal of the semiconductor chip, the second adjustable capacitor is connected to the input terminal of the antenna impedance matching apparatus by using the fourth terminal of the semiconductor chip and the fourth inductor, the first switch is grounded by using the third terminal of the semiconductor chip and the fifth inductor, and the second switch is grounded by using the sixth terminal of the semiconductor chip and the third capacitor.

With reference to the sixth possible implementation manner, in an eleventh possible implementation manner, the impedance matching apparatus is a double PI-type impedance matching network, and the at least one impedance component includes: a second inductor, a third inductor, a fourth inductor, and an eighth inductor, where the first adjustable capacitor is connected to the input terminal of the antenna impedance matching apparatus through the first terminal of the semiconductor chip, is grounded through the second terminal of the semiconductor chip, and is connected to the fourth terminal of the semiconductor chip through the first terminal of the semiconductor chip and the fourth inductor, the second adjustable capacitor is connected to the output terminal of the antenna impedance matching apparatus through the fourth terminal of the semiconductor chip and the eighth inductor and is grounded through the fifth terminal of the semiconductor chip, the third adjustable capacitor is connected to the output terminal of the antenna impedance matching apparatus through the seventh terminal of the semiconductor chip and is grounded through the eighth terminal, the input terminal of the antenna impedance matching apparatus is grounded through the third inductor, and the output terminal of the antenna impedance matching apparatus is grounded through the second inductor.

With reference to the eleventh possible implementation manner, in a twelfth possible implementation manner, the at least one impedance component further includes: a ninth inductor, a tenth inductor, and an eleventh inductor, where the ninth inductor is connected between the fourth inductor and the fourth terminal of the semiconductor chip, and the first switch is connected to the fourth inductor and the ninth inductor through the third terminal of the semiconductor chip, so as to bypass the fourth inductor when the first switch is closed, the tenth inductor is connected between the eighth inductor and the seventh terminal of the semiconductor chip, and the third switch is connected to the eighth inductor and the tenth inductor through the ninth terminal of the semiconductor chip, so as to bypass the tenth inductor when the third switch is closed, and the second switch is grounded through the sixth terminal of the semiconductor chip and the eleventh inductor.

With reference to the sixth possible implementation manner, in a thirteenth possible implementation manner, the at least one impedance component further includes: a fifth inductor and a seventh inductor, where the first adjustable capacitor is connected to the input terminal of the antenna impedance matching apparatus through the first terminal of the semiconductor chip and is grounded through the second terminal of the semiconductor chip, the second adjustable capacitor is connected to the input terminal of the antenna impedance matching apparatus through the fourth terminal of the semiconductor chip and is connected to the output terminal of the antenna impedance matching apparatus through the fifth terminal of the semiconductor chip, the third adjustable capacitor is connected to the output terminal of the semiconductor chip through the seventh terminal of the semiconductor chip and is grounded through the eighth terminal of the semiconductor chip, the first switch is grounded through the third terminal of the semiconductor chip and the fifth inductor, the second switch is connected to the output terminal of the antenna impedance matching apparatus through the sixth terminal of the semiconductor chip, the third switch is grounded through the eighth terminal of the semiconductor chip, and the multiple adjustable capacitors are adjusted to minimum values to bypass the semiconductor chip when the second switch is closed.

With reference to the first aspect or any one of the foregoing possible implementation manners, in a fourteenth possible implementation manner, the at least one impedance component and the semiconductor chip are located on a printed circuit board PCB.

With reference to the first aspect or any one of the foregoing possible implementation manners, in a fifteenth possible implementation manner, the semiconductor chip and the at least one impedance component are located on a base board and integrated in a single package.

With reference to the first aspect or any one of the foregoing possible implementation manners, in a sixteenth possible implementation manner, the antenna impedance matching apparatus further includes: a configuration module, coupled to the semiconductor chip; and configured to generate the control signal and the adjustment signal, and send the generated control signal and adjustment signal to the semiconductor chip by using a software interface, so as to configure capacitance values of the multiple adjustable capacitors and states of the multiple switches.

According to a second aspect, a semiconductor chip is provided and configured to adjust impedance matching of an antenna, and includes: a control circuit, configured to generate a control signal and an adjustment signal; multiple adjustable capacitors; and multiple switches, configured to, under control of the control signal, switch a connection between the multiple adjustable capacitors and at least one impedance component outside the semiconductor chip, where values of the multiple adjustable capacitors are adjusted by the adjustment signal, so as to tune impedance matching of an antenna that is formed by the semiconductor chip and the at least one impedance component.

With reference to the second aspect, in a first possible implementation manner, the multiple switches are configured to: when the multiple switches are in an open state or a closed state, perform at least one of the following connections on the multiple adjustable capacitors and the at least one impedance component: parallel connection, series connection, and bypassing, so as to tune the impedance matching of the antenna.

With reference to the first possible implementation manner of the second aspect, in a second possible implementation manner, one terminal of each switch in the multiple switches and one terminal of each adjustable capacitor in the multiple adjustable capacitors are connected to a same terminal of the semiconductor chip, and the other terminal of each switch in the multiple switches and the other terminal of each adjustable capacitor in the multiple adjustable capacitors are respectively connected to other terminals of the semiconductor chip.

With reference to the second aspect or any one of the foregoing possible implementation manners of the second aspect, in a third possible implementation manner, the multiple adjustable capacitors include a first adjustable capacitor and a second adjustable capacitor, and the multiple switches include a first switch and a second switch, where a first terminal and a second terminal of the first adjustable capacitor are respectively connected to a first terminal and a second terminal of the semiconductor chip, a first terminal and a second terminal of the second adjustable capacitor are respectively connected to a fourth terminal and a fifth terminal of the semiconductor chip, a first terminal and a second terminal of the first switch are respectively connected to the first terminal and a third terminal of the semiconductor chip, and a first terminal and a second terminal of the second switch are respectively connected to the fourth terminal and a sixth terminal of the semiconductor chip.

With reference to the fourth possible implementation manner of the second aspect, in a fifth possible implementation manner, the multiple adjustable capacitors further include a third adjustable capacitor, the multiple switches further include a third switch, a first terminal and a second terminal of the third adjustable capacitor are respectively connected to a seventh terminal and an eighth terminal of the semiconductor chip, and a first terminal and a second terminal of the third switch are respectively connected to the seventh terminal and a ninth terminal of the semiconductor chip.

According to a third aspect, an antenna impedance matching method is provided and includes: providing multiple adjustable capacitors and multiple switches on a semiconductor chip, where the semiconductor chip is coupled to at least one impedance component through multiple terminals and coupled to an input terminal and an output terminal of an antenna impedance matching apparatus, the input terminal and the output terminal of the antenna impedance matching apparatus are respectively coupled to a radio frequency circuit and an antenna; and switching, under control of a control signal, a connection between the multiple adjustable capacitors and at least one impedance component outside the semiconductor chip by using the multiple switches, and adjusting, by an adjustment signal, values of the multiple adjustable capacitors, so as to tune impedance matching of the antenna.

With reference to the third aspect, in a first possible implementation manner, the switching a connection between the multiple adjustable capacitors and at least one impedance component outside the semiconductor chip by using the multiple switches, so as to tune impedance matching of the antenna includes: configuring capacitance values of the multiple adjustable capacitors by using a software interface, and configuring states of the multiple switches according to the software interface, so as to tune the impedance matching of the antenna.

With reference to the first possible implementation manner of the third aspect, in a second possible implementation manner, the switching, under control of a control signal, a connection between the multiple adjustable capacitors and at least one impedance component outside the semiconductor chip by using the multiple switches, so as to tune impedance matching of the antenna includes: performing, under the control of the control signal and by using the multiple switches, at least one of the following on the multiple adjustable capacitors and the at least one impedance component: parallel connection, series connection, and bypassing, so as to tune the impedance matching of the antenna.

In the embodiments of the present invention, an antenna impedance matching apparatus may be formed by a semiconductor chip that includes multiple adjustable capacitors and switches, and an impedance component outside the semiconductor chip, and different equivalent adjustable impedance ranges are implemented by switching of the switches, which can expand frequency coverage for tuning antenna impedance, thereby flexibly tuning the antenna impedance according to a requirement.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

It should be understood that the technical solutions of the present invention may be applied to various communications systems, for example, a GSM (Global System of Mobile communication, Global System for Mobile Communications) system, a CDMA (Code Division Multiple Access, Code Division Multiple Access) system, a CDMA2000 system, a WCDMA (Wideband Code Division Multiple Access, Wideband Code Division Multiple Access) system, a GPRS (General Packet Radio Service, General Packet Radio Service) system, an LTE (Long Term Evolution, Long Term Evolution) system, an LTE-A (Advanced long term evolution, Advanced Long Term Evolution) system, UMTS (Universal Mobile Telecommunication System, Universal Mobile Telecommunications System), the Enhanced Data rates for GSM Evolution technology (Enhanced Data Rate for GSM Evolution, EDGE), the High Speed Packet Access technology (High Speed Packet Access, HSPA), Time Division-Synchronous Code Division Multiple Access (Time Division-Synchronous Code Division Multiple Access, TD-SCDMA), a wireless local area network (Wireless Local Area Networks, WLAN), Bluetooth (Bluetooth), the Global Positioning System (Global Position System, GPS), and a Near Field Communication (Near Field Communication, NFC) system, which are not limited in the embodiments of the present invention.

It should be further understood that, the embodiments of the present invention may be used in various user equipments (UE, User Equipment), including but not limited to a mobile station (MS, Mobile Station), a mobile terminal (Mobile Terminal), a mobile telephone (Mobile Telephone), a handset (handset), a portable equipment (portable equipment), and the like. For example, the user equipment may be a mobile phone (or referred to as a "cellular" phone), or a computer with a radio communication function. The user equipment may further be a portable, pocket-sized, handheld, computer built-in, or vehicle-mounted mobile apparatus, (Personal Digital Assistant, PDA), a tablet computer, a data card, or the like.

Figure 1:
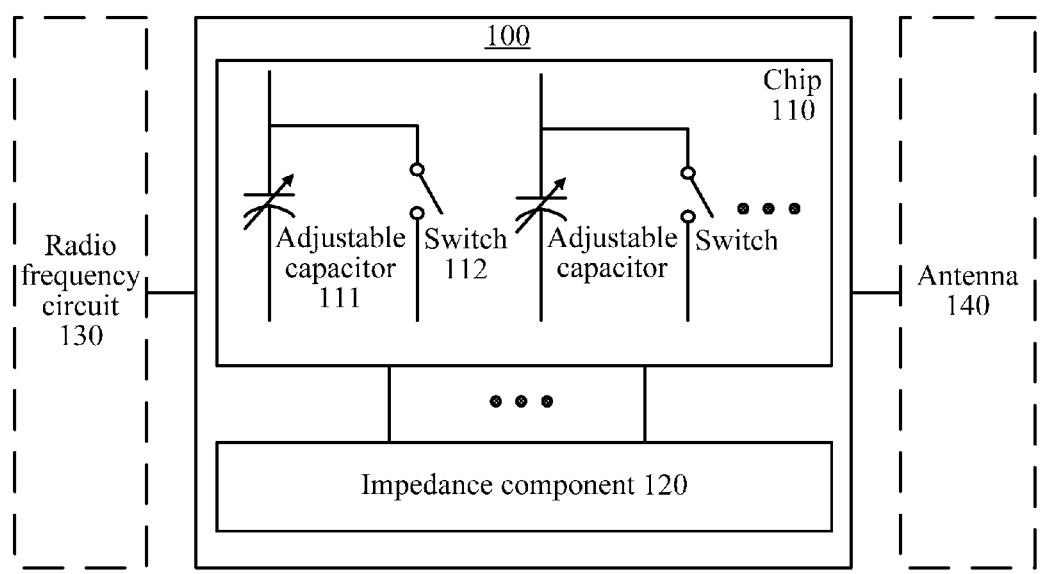
FIG. 1 is a schematic structural diagram of an antenna impedance matching apparatus according to an embodiment of the present invention.

FIG. 1 is a schematic structural diagram of an antenna impedance matching apparatus 100 according to an embodiment of the present invention. The antenna impedance matching apparatus 100 may be an antenna tuner. The antenna impedance matching apparatus 100 includes a semiconductor chip 110 and at least one impedance matching component 120.

Referring to FIG. 1, the semiconductor chip 110 may include multiple adjustable capacitors 111 and multiple switches 112. The at least one impedance component 120 is located outside the semiconductor chip 110, the semiconductor chip 110 is coupled to the at least one impedance component 120 through multiple terminals and coupled to an input terminal and an output terminal of the antenna impedance matching apparatus 100, and the input terminal and the output terminal of the antenna impedance matching apparatus 100 are respectively coupled to a radio frequency circuit 130 and an antenna 140, where the multiple switches 112 are configured to, under control of a control signal, switch a connection between the multiple adjustable capacitors 111 and the at least one impedance component 120, and values of the multiple adjustable capacitors 111 are adjusted by an adjustment signal, so as to tune impedance matching of the antenna. The radio frequency circuit may be a radio transceiver (Transceiver), configured to modulate or demodulate an antenna signal.

In the embodiment of the present invention, an antenna impedance matching apparatus may be formed by a semiconductor chip that includes multiple adjustable capacitors and switches and an impedance component outside the semiconductor chip, and an adjustable impedance range is implemented by switching of the switches, which can expand frequency coverage, thereby flexibly tuning impedance matching according to a requirement.

According to the embodiment of the present invention, one terminal of at least one switch in the multiple switches and one terminal of at least one adjustable capacitor in the multiple adjustable capacitors are connected to a same terminal of the semiconductor chip, and the other terminal of the at least one switch in the multiple switches and the other terminal of the at least one adjustable capacitor in the multiple adjustable capacitors are respectively connected to other terminals of the semiconductor chip.

For example, the multiple switches may correspond to the multiple adjustable capacitors, and one terminal of each switch in the multiple switches is connected to one terminal of a corresponding adjustable capacitor. One terminal of each switch in the multiple switches and one terminal of the corresponding adjustable capacitor are connected to a same terminal of the semiconductor chip, and the other terminal of each switch in the multiple switches and the other terminal of the corresponding adjustable capacitor are respectively connected to two terminals of the semiconductor chip. In this way, an input and output (IO) quantity can be reduced, and configuration flexibility can also be ensured.

According to the embodiment of the present invention, the multiple switches are configured to: when the multiple switches are in an open state or a closed state, perform at least one of the following connections on the multiple adjustable capacitors and the at least one impedance component: parallel connection, series connection, and bypassing, so as to tune the impedance matching of the antenna. A component is bypassed by using a switch, that is, the switch is connected in parallel to the component so that the component stops working when the switch is closed.

For example, the adjustable capacitors in the semiconductor chip and the impedance matching component outside the semiconductor chip may be connected in parallel or in series by setting a state of the switch to be open or closed, and the embodiment according to the present invention is not limited thereto. For example, multiple impedance matching components outside the semiconductor chip may also be connected in parallel or in series, or the impedance components outside the semiconductor chip may be bypassed, or a specific adjustable capacitor in the semiconductor chip may be bypassed, thereby adjusting an impedance value of the antenna impedance configuration apparatus.

According to the embodiment of the present invention, the at least one impedance component may be located on a printed circuit board (Print Circuit Board, PCB). The chip 110 may also be located on the PCB.

According to the embodiment of the present invention, the semiconductor chip and the at least one impedance component may be located on a base board, and integrated in a single package.

The antenna impedance matching apparatus in the embodiment of the present invention may implement an antenna tuner of broadband frequency coverage by using a semiconductor chip and a fixed off-chip impedance component. In addition, a fixed inductor/or capacitor component outside the semiconductor chip may further be integrated in a package, so as to further reduce a cost and decrease a PCB area.

As an optional implementation manner, according to the embodiment of the present invention, the semiconductor chip includes a control circuit (which is not shown in FIG. 1), configured to generate the control signal and the adjustment signal. The control circuit connects control terminals of each switch and adjustable capacitor, and adjusts the adjustable capacitor and controls opening and closing of the switch. The control circuit generates a control instruction by running control software, the control software may be stored in a memory in a form of computer code, and the control circuit reads the code to run a software program to control capacitance values of multiple adjustable capacitors and states of multiple switches.

Optionally, as another optional implementation manner, the antenna impedance matching apparatus 100 further includes: a configuration module, coupled to the semiconductor chip 110; and configured to generate the control signal and the adjustment signal, and send the generated control signal and adjustment signal to the semiconductor chip 110 by using a software interface, so as to configure the capacitance values of the multiple adjustable capacitors and the states of the multiple switches. Different from the control circuit in the foregoing implementation manner, the configuration module in this example may not be included inside the semiconductor chip, but is located outside the semiconductor chip as an independent control system, and controls the semiconductor chip by using the software interface.

For example, software may be used to control switching of the switches to implement different matching network topologies, so as to adapt to antennas with different impedance characteristics, thereby flexibly configuring matching network topologies. Moreover, different matching network circuits may be configured for different applications, user equipment forms or antenna designs. In this way, a semiconductor chip configured to tune antenna impedance may be used as a general component, thereby reducing a development cost.

Figure 2:
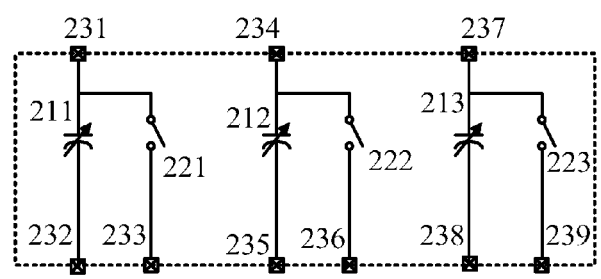
FIG. 2 is a schematic structural diagram of a semiconductor chip according to an embodiment of the present invention.

FIG. 2 is a schematic structural diagram of a semiconductor chip 210 according to an embodiment of the present invention. The semiconductor chip 210 is configured to adjust impedance matching of an antenna, and may include multiple adjustable capacitors and multiple switches, which are similar to the multiple adjustable capacitors and the multiple switches in FIG. 1, and detailed descriptions are properly omitted herein.

Optionally, as another embodiment, the semiconductor chip 210 may further include a control circuit, configured to generate a control signal and an adjustment signal.

According to the embodiment of the present invention, the multiple adjustable capacitors may include a first adjustable capacitor 211 and a second adjustable capacitor 212, and the multiple switches include a first switch 221 and a second switch 222, where a first terminal and a second terminal of the first adjustable capacitor 211 are respectively connected to a first terminal 231 and a second terminal 232 of the semiconductor chip, a first terminal and a second terminal of the second adjustable capacitor 212 are respectively connected to a fourth terminal 234 and a fifth terminal 235 of the semiconductor chip, a first terminal and a second terminal of the first switch 221 are respectively connected to the first terminal 231 and a third terminal 233 of the semiconductor chip, and a first terminal and a second terminal of the second switch 222 are respectively connected to the fourth terminal 234 and a sixth terminal 236 of the semiconductor chip.

For example, each adjustable capacitor cooperates with a switch connected in parallel to form a capacitor-switch pair (or combination), and multiple capacitor-switch pairs may be integrated inside a single semiconductor chip. For example, one semiconductor chip may integrate 2 to 4 capacitor-switch pairs. Particularly, one pin of each switch is connected to one pin of a corresponding adjustable capacitor, and connected to a same terminal of the semiconductor chip; and the other pin of each switch and the other pin of the corresponding adjustable capacitor are separated from each other and are respectively connected to other two pins of the semiconductor chip. In this way, an input and output (IO) quantity can be reduced, and configuration flexibility can also be ensured.

In the embodiment of the present invention, multiple adjustable capacitors and switches can be integrated in a semiconductor chip, so that the semiconductor chip and an impedance component outside the semiconductor chip form an antenna impedance matching apparatus, and different equivalent adjustable impedance ranges can be implemented by switching of the switches, which can expand frequency coverage for tuning an antenna, thereby flexibly tuning antenna impedance according to a requirement.

Optionally, as another embodiment, the multiple adjustable capacitors further include a third adjustable capacitor 213, and the multiple switches further include a third switch 223, where a first terminal and a second terminal of the third adjustable capacitor 213 are respectively connected to a seventh terminal 237 and an eighth terminal 238 of the semiconductor chip, and a first terminal and a second terminal of the third switch 223 are respectively connected to the seventh terminal 237 and a ninth terminal 239 of the semiconductor chip.

Optionally, as another embodiment, the first terminal and the second terminal of the third switch 223 are respectively connected to the first terminal and the second terminal of the third adjustable capacitor 213, and connected to the eighth terminal 238. That is, the eighth terminal 238 and the ninth terminal 239 may be combined into one terminal, so that when the third switch 223 is closed, the third adjustable capacitor 213 may be bypassed.

It should be understood that the number of adjustable capacitors and the number of switches are not limited in the embodiment of the present invention, and the number of adjustable capacitors and the number of switches may be the same or may also be different.

Figure 3:
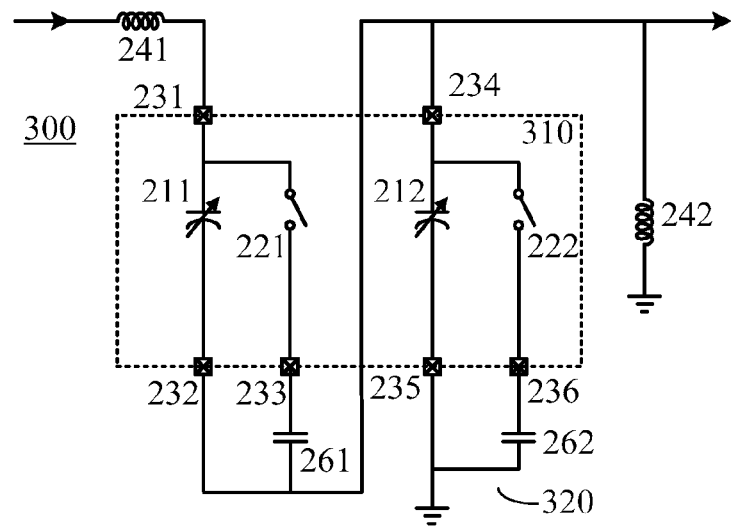
FIG. 3 is a schematic structural diagram of an antenna impedance matching apparatus according to another embodiment of the present invention.

FIG. 3 is a schematic structural diagram of an antenna impedance matching apparatus 300 according to another embodiment of the present invention. The antenna impedance matching apparatus 300 includes a semiconductor chip 310 and at least one impedance matching component 320. The semiconductor chip 310 in FIG. 3 is similar to the semiconductor chip 210 in FIG. 2, and details are not repeatedly described herein.

According to the embodiment of the present invention, the at least one impedance component 320 includes: a first inductor 241 and a second inductor 242, where the antenna impedance matching apparatus is an L-type impedance matching network, a first adjustable capacitor 211 is connected to an input terminal of the antenna impedance matching apparatus by using a first terminal 231 of the semiconductor chip and the first inductor 241, the first adjustable capacitor 211 is connected to an output terminal of the antenna impedance matching apparatus by using a second terminal 232 of the semiconductor chip, a second adjustable capacitor 212 is connected to the output terminal of the antenna impedance matching apparatus by using a fourth terminal 234 of the semiconductor chip and is grounded by using a fifth terminal 235 of the semiconductor chip, and the output terminal of the antenna impedance matching apparatus is grounded through the second inductor 242.

Optionally, as another embodiment, the at least one impedance component 320 further includes: a first capacitor 261 and a second capacitor 262, where a first switch 221 is connected to the output terminal of the antenna impedance matching apparatus by using a third terminal 233 of the semiconductor chip and the first capacitor 261, so that the first adjustable capacitor 211 is connected in parallel to the first capacitor 261 when the first switch 221 is closed, and a second switch 222 is grounded by using a sixth terminal 236 of the semiconductor chip and the second capacitor 262, so that the second adjustable capacitor 212 is connected in parallel to the second capacitor 262 when the second switch 222 is closed.

Compared with a PI-type impedance matching network, a conventional L-type impedance matching network only covers about half an impedance plane (where the impedance plane refers to an impedance range on a Smith chart) within a range of a frequency band. For example, the L-type impedance matching network may be an L-type impedance matching network that is obtained after a specific frequency band (for example, a high frequency band 1700 MHz-2170 MHz) is optimized, and therefore may be used for an antenna with known impedance characteristics. If the impedance matching network works at a low frequency band, an impedance range cannot meet a requirement, because in the impedance matching network, a range of an adjustable capacitance value is limited, and a maximum capacitance value at the low frequency band is limited by a possible maximum value that can be implemented in the semiconductor chip, thereby causing deterioration of tuning performance of an antenna at the low frequency band. On the other hand, at a super high frequency band (for example, 2.7 GHz), a minimum capacitance value is limited by a possible minimum value that can be implemented in the semiconductor chip, which also causes deterioration of tuning performance of an antenna at the low frequency band.

In this embodiment, the impedance matching component may be a board-level fixed capacitor component located outside the semiconductor chip. The antenna impedance matching apparatus may be implemented by using the semiconductor chip and the board-level fixed capacitor component, and a connection between the fixed capacitor and the adjustable capacitor may be switched by using a switch inside the semiconductor chip. By setting a state of the switch to be open or closed, the adjustable capacitor inside the semiconductor chip and the capacitor outside the semiconductor chip may be connected in parallel or in series, or multiple capacitors outside the semiconductor chip may be connected in parallel or in series, thereby adjusting a capacitance value of the antenna impedance matching apparatus, that is, extending a range of a capacitance value of the adjustable capacitor by switching of the switch.

For example, when the first switch 221 is open, the range of the capacitance value of the adjustable capacitor is 0-4 pF; when the first switch 221 is closed, the first capacitor 261 (for example, with a capacitance value of 4 pF) fixed outside the semiconductor chip is connected in parallel to the first adjustable capacitor 211 inside the semiconductor chip; and a range of a capacitance value of the first capacitor 261 and the first adjustable capacitor 211 changes to 4-8 pF, so that a total equivalent capacitance range of the first capacitor 261 and the first adjustable capacitor 211 extends to 0-8 pF. Similarly, the second switch 222 may also connect the second adjustable capacitor 212 to the second capacitor 262 (for example, with a capacitance value of 4 pF) in parallel when the second switch is closed, so that a total equivalent capacitance range of the second adjustable capacitor 212 and the second capacitor 262 extends to 0-8 pF. When a user equipment needs to work at a wider frequency range (for example, a full frequency band with a range of 700 MHz-2.7 GHz), a capacitor of another capacitance value may be switched. In this way, the antenna impedance matching apparatus can cover both a high frequency band and a low frequency band, thereby expanding frequency coverage.

Figure 4:
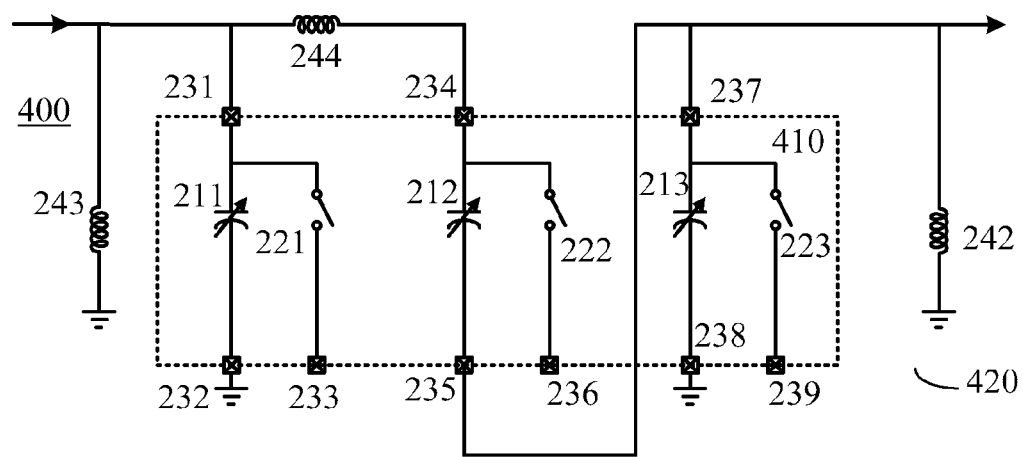
FIG. 4 is a schematic structural diagram of an antenna impedance matching apparatus according to another embodiment of the present invention.

FIG. 4 is a schematic structural diagram of an antenna impedance matching apparatus 400 according to another embodiment of the present invention. A semiconductor chip 410 is similar to the semiconductor chip 210 in FIG. 2, and details are not repeatedly described herein.

According to the embodiment of the present invention, at least one adjustable capacitor further includes a third adjustable capacitor 213, and multiple switches further include a third switch 223, where a first terminal and a second terminal of the third adjustable capacitor 213 are respectively connected to a seventh terminal 237 and an eighth terminal 238 of the semiconductor chip, and a first terminal and a second terminal of the third switch 223 are respectively connected to the seventh terminal 237 and a ninth terminal 239 of the semiconductor chip.

According to the embodiment of the present invention, the antenna impedance matching apparatus 400 is a PI-type impedance matching network, at least one impedance component 420 includes: a second inductor 242, a third inductor 243, and a fourth inductor 244, where a first adjustable capacitor 211 is connected to an input terminal of the antenna impedance matching apparatus by using a first terminal 231 of the semiconductor chip and is grounded by using a second terminal 232 of the semiconductor chip, a second adjustable capacitor 212 is connected to the input terminal of the antenna impedance matching apparatus by using a fourth terminal 234 of the semiconductor chip, is connected to an output terminal of the antenna impedance matching apparatus by using a fifth terminal 235 of the semiconductor chip, and is connected in series to the fourth inductor 244 through the fourth terminal 234 of the semiconductor chip, that is, the second adjustable capacitor 212 is connected to the input terminal of the antenna impedance matching apparatus through the fourth terminal 234 of the semiconductor chip and the fourth inductor 244, the third adjustable capacitor 213 is connected to the output terminal of the antenna impedance matching apparatus by using the seventh terminal 237 of the semiconductor chip and is grounded by using the eighth terminal 238, the input terminal of the antenna impedance matching apparatus is grounded through the third inductor 243, and the output terminal of the antenna impedance matching apparatus is grounded through the second inductor 242.

Figure 5:
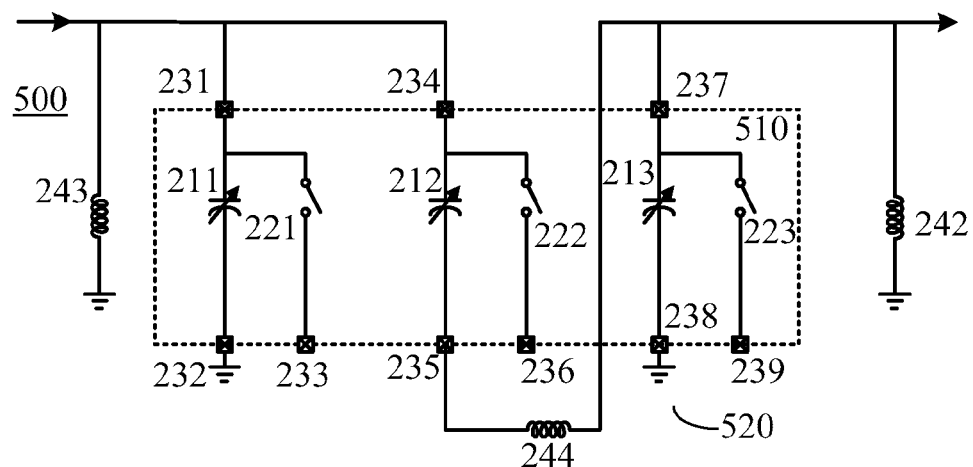
FIG. 5 is a schematic structural diagram of an antenna impedance matching apparatus according to another embodiment of the present invention.

FIG. 5 is a schematic structural diagram of an antenna impedance matching apparatus 500 according to another embodiment of the present invention. A semiconductor chip 510 is similar to the semiconductor chip 210 in FIG. 2, and details are not repeatedly described herein.

According to the embodiment of the present invention, the antenna impedance matching apparatus 500 is a PI-type impedance matching network, at least one impedance component 520 includes: a second inductor 242, a third inductor 243, and a fourth inductor 244, where a first adjustable capacitor 211 is connected to an input terminal of the antenna impedance matching apparatus by using a first terminal 231 of the semiconductor chip and is grounded by using a second terminal 232 of the semiconductor chip, a second adjustable capacitor 212 is connected to the input terminal of the antenna impedance matching apparatus by using a fourth terminal 234 of the semiconductor chip, is connected to an output terminal of the antenna impedance matching apparatus by using a fifth terminal 235 of the semiconductor chip, and is connected in series to the fourth inductor 244 through the fifth terminal 235 of the semiconductor chip, that is, the second adjustable capacitor is connected to the output terminal of the antenna impedance matching apparatus through the fifth terminal 235 of the semiconductor chip and the fourth inductor 244, a third adjustable capacitor 213 is connected to the output terminal of the antenna impedance matching apparatus by using a seventh terminal 237 of the semiconductor chip and is grounded by using an eighth terminal 238, the input terminal of the antenna impedance matching apparatus is grounded through the third inductor 243, and the output terminal of the antenna impedance matching apparatus is grounded through the second inductor 242.

For a range of a single frequency band (for example, a range of a low frequency band of 700 M-900 MHz), a conventional PI-type impedance matching network may cover a range of a change in antenna impedance when the antenna impedance is affected by an environment. However, if an antenna also supports a range of a high frequency band of 1700 M-2100 MHz, the conventional PI-type impedance matching network cannot completely cover the range of the change in the antenna impedance at the high frequency band. This is because it is difficult for a conventional PI-type impedance matching apparatus to implement a high quality adjustable inductor on the semiconductor chip, and therefore, only a capacitance value is adjustable but an inductance value is fixed.

Figure 6:
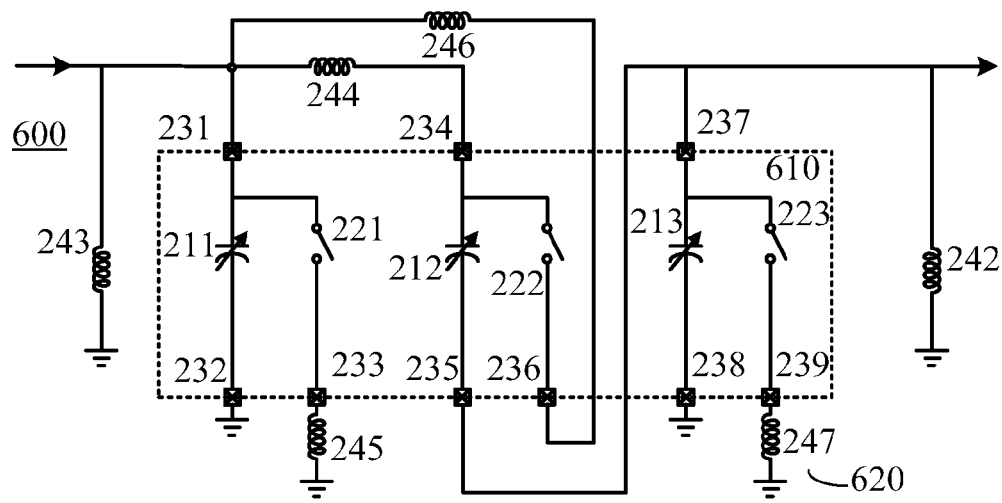
FIG. 6 is a schematic structural diagram of an antenna impedance matching apparatus according to another embodiment of the present invention.

FIG. 6 is a schematic structural diagram of an antenna impedance matching apparatus 600 according to another embodiment of the present invention. The antenna impedance matching apparatus 600 includes a semiconductor chip 610 and at least one impedance component 620. The semiconductor chip 610 and the at least one impedance component 620 are similar to the semiconductor chip 410 and the at least one impedance component 420 in FIG. 4, and details are not repeatedly described herein.

According to the embodiment of the present invention, the at least one impedance component 620 further includes: a fifth inductor 245, a sixth inductor 246, and a seventh inductor 247, where a first switch 221 is grounded by using a third terminal 233 of the semiconductor chip and a fifth inductor 245, so that a third inductor 243 is connected in parallel to the fifth inductor 245, a second switch 222 is connected in series to the sixth inductor 246 by using a fourth terminal 234 or a sixth terminal 236 of the semiconductor chip, so that a fourth inductor 244 is connected in parallel to the sixth inductor 246, and a third switch 223 is grounded by using a ninth terminal 239 of the semiconductor chip and the seventh inductor 247, so that a second inductor 242 is connected in parallel to the seventh inductor 247.

In this embodiment, the antenna impedance matching apparatus 600 is implemented by using the semiconductor chip and a board-level fixed inductor component, and a fixed inductor outside the semiconductor chip may be switched by a switch inside the semiconductor chip, that is, an equivalent adjustable inductor may be implemented by switching of the switch. For example, an impedance matching component may be an inductor located outside the semiconductor chip, and may, by setting a state of a switch to be open or closed, connect an adjustable capacitor inside the semiconductor chip to an inductor outside the semiconductor chip in parallel or in series, or connect multiple inductors outside the semiconductor chip in parallel or in series, thereby adjusting an inductance value of the antenna impedance configuration apparatus.

For example, when a user equipment works at a low frequency band, the switch is open; and when the user equipment works at a high frequency band, the switch is closed. In this way, an inductor connected to the switch is connected in parallel to another inductor inside the semiconductor chip, thereby reducing an equivalent inductance value by half. Therefore, when the user equipment works at a high or low frequency band, the equivalent inductance value of a matching network is variable, thereby expanding frequency coverage of the matching network. Similarly, when the user equipment needs to work at a higher frequency band (for example, an LTE frequency band of 2.5 GHz-2.7 GHz), an inductor with another inductance value may be switched.

Figure 7:
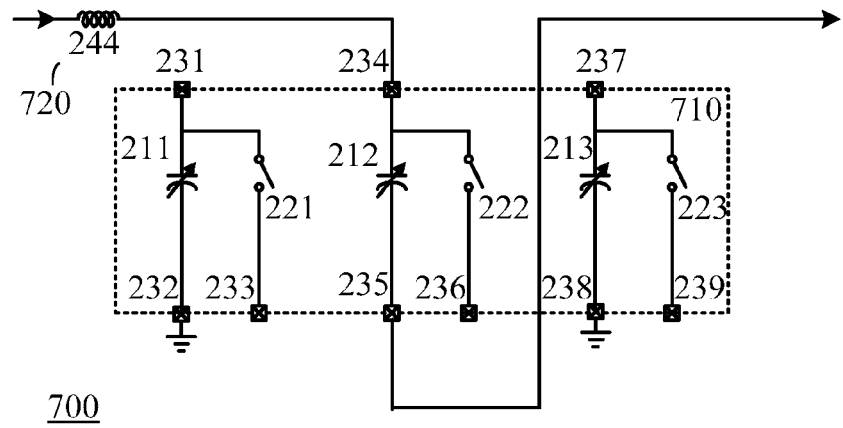
FIG. 7 is a schematic structural diagram of an antenna impedance matching apparatus according to another embodiment of the present invention.

FIG. 7 is a schematic structural diagram of an antenna impedance matching apparatus 700 according to another embodiment of the present invention. The antenna impedance matching apparatus 700 includes a semiconductor chip 710 and at least one impedance component 720. The semiconductor chip 710 is similar to the semiconductor chip 210 in FIG. 2, and details are not repeatedly described herein.

According to the embodiment of the present invention, at least one adjustable capacitor further includes a third adjustable capacitor 213, and multiple switches further include a third switch 223, where a first terminal and a second terminal of the third adjustable capacitor 213 are respectively connected to a seventh terminal 237 and an eighth terminal 238 of the semiconductor chip, and a first terminal and a second terminal of the third switch 223 are respectively connected to the seventh terminal 237 and a ninth terminal 239 of the semiconductor chip.

According to the embodiment of the present invention, the at least one impedance component 720 includes a fourth inductor 244, the antenna impedance matching apparatus is an LC-type impedance matching network, and one of multiple adjustable capacitors and the fourth inductor 244 are connected in series between an output terminal and an input terminal of the antenna impedance matching apparatus.

For antennas with different impedance characteristics, matching capacitors of different topologies generally need to be used to implement tuning of antenna impedance. In a case in which a range of a change in the antenna impedance is clear after testing or adjusting, the L-type impedance matching network in FIG. 3 may be used. However, for some antennas, an impedance matching network may be further simplified into the series LC matching network in FIG. 7. For example, the impedance matching network may be simplified by opening the first switch 221 and the third switch 223 and closing the second switch in FIG. 7, thereby largely reducing a quantity of off-chip components and a PCB area of a simplified impedance matching network.

Figure 8:
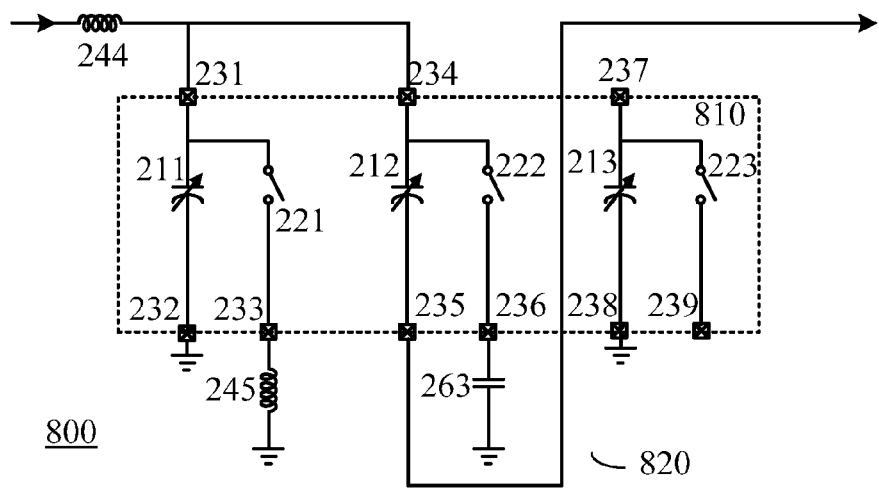
FIG. 8 is a schematic structural diagram of an antenna impedance matching apparatus according to another embodiment of the present invention.

FIG. 8 is a schematic structural diagram of an antenna impedance matching apparatus 800 according to another embodiment of the present invention. The antenna impedance matching apparatus 800 includes a semiconductor chip 810 and at least one impedance component 820. The semiconductor chip 810 and the at least one impedance component 820 are similar to the semiconductor chip 710 and the at least one impedance component 720 in FIG. 7, and details are not repeatedly described herein.

In this embodiment, the at least one impedance component 820 further includes: a fifth inductor 245 and a third capacitor 263, where a first adjustable capacitor 211 is connected to an input terminal of the antenna impedance matching apparatus by using a first terminal 231 of the semiconductor chip and a fourth inductor 244 and is grounded by using a second terminal 232 of the semiconductor chip, a second adjustable capacitor 212 is connected to the input terminal of the antenna impedance matching apparatus by using a fourth terminal 234 of the semiconductor chip and the fourth inductor 244, a first switch 221 is grounded by using a third terminal 233 of the semiconductor chip and the fifth inductor 245, and a second switch 222 is grounded by using a sixth terminal 236 of the semiconductor chip and the third capacitor 263.

In other words, the at least one impedance component may be a combination of an inductor and a capacitor, so that tuning of antenna impedance matching is more flexible.

Figure 9:
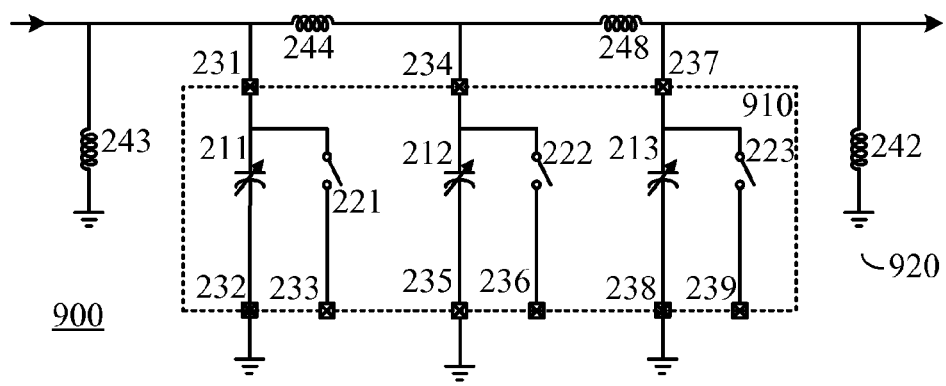
FIG. 9 is a schematic structural diagram of an antenna impedance matching apparatus according to another embodiment of the present invention.

FIG. 9 is a schematic structural diagram of an antenna impedance matching apparatus 900 according to another embodiment of the present invention. The antenna impedance matching apparatus 900 includes a semiconductor chip 910 and at least one impedance component 920. The semiconductor chip 910 is similar to the semiconductor chip 210 in FIG. 2, and details are not repeatedly described herein.

According to the embodiment of the present invention, the impedance matching apparatus is a double PI-type impedance matching network, and the at least one impedance component 920 includes: a second inductor 242, a third inductor 243, a fourth inductor 244, and an eighth inductor 248, where a first adjustable capacitor 211 is connected to an input terminal of the antenna impedance matching apparatus by using a first terminal 231 of the semiconductor chip, is grounded by using a second terminal 232 of the semiconductor chip, and is connected to a fourth terminal 234 of the semiconductor chip through the first terminal 231 of the semiconductor chip and the fourth inductor 244, a second adjustable capacitor 212 is connected to an output terminal of the antenna impedance matching apparatus through the fourth terminal 234 of the semiconductor chip and the eighth inductor 248 and is grounded by using a fifth terminal 235 of the semiconductor chip, a third adjustable capacitor 213 is connected to the output terminal of the antenna impedance matching apparatus by using a seventh terminal 237 of the semiconductor chip and is grounded by using an eighth terminal 238, the input terminal of the antenna impedance matching apparatus is grounded through the third inductor 243, and the output terminal of the antenna impedance matching apparatus is grounded through the second inductor 242.

To shorten a product development cycle, some user equipment manufacturers may hope not to perform adjusting on antenna impedance for each product separately. In this case, when an antenna mismatch occurs, the antenna impedance that is seen from a radio frequency transceiver nearly may be any value (any point on a Smith chart is possible), and in this case, impedance coverage of the antenna impedance matching apparatus needs to be as large as possible. The double (Double) PI-type matching network in this embodiment can provide better performance and flexibility.

Figure 10:
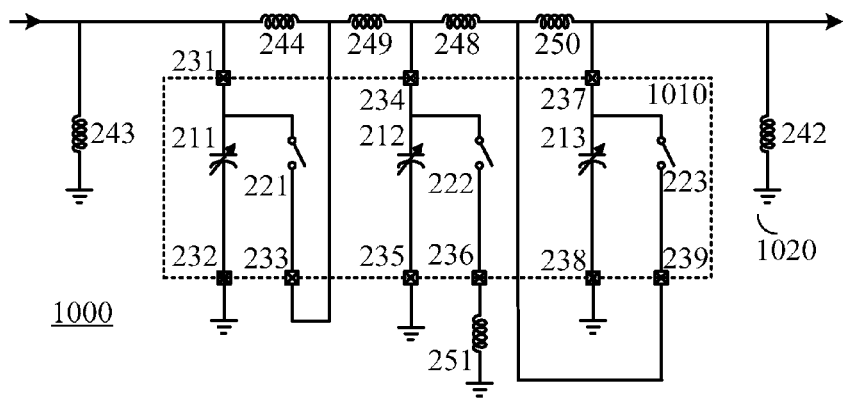
FIG. 10 is a schematic structural diagram of an antenna impedance matching apparatus according to another embodiment of the present invention.

FIG. 10 is a schematic structural diagram of an antenna impedance matching apparatus 1000 according to another embodiment of the present invention. The antenna impedance matching apparatus 1000 includes a semiconductor chip 1010 and at least one impedance component 1020. The semiconductor chip 1010 and the at least one impedance component 1020 are similar to the semiconductor chip 900 and the at least one impedance component 1020 in FIG. 9, and details are not repeatedly described herein.

Different from the embodiment of FIG. 9, the at least one impedance component 1020 further includes: a ninth inductor 249, a tenth inductor 250, and an eleventh inductor 251, where the ninth inductor 249 is connected between a fourth inductor 244 and a fourth terminal 234 of the semiconductor chip, a first switch 221 is connected to the fourth inductor 244 and the ninth inductor 249 by using a third terminal 233 of the semiconductor chip, so as to bypass the fourth inductor 244 when the first switch 221 is closed, the tenth inductor 250 is connected between an eighth inductor 248 and a seventh terminal 237 of the semiconductor chip, a third switch 223 is connected to the eighth inductor 248 and the tenth inductor 250 by using a ninth terminal 239 of the semiconductor chip, so as to bypass the tenth inductor 250 when the third switch 223 is closed, and a second switch 222 is grounded by using a sixth terminal 236 of the semiconductor chip and the eleventh inductor 251.

In this embodiment, an additional off-chip fixed inductor is added to a double PI-type network to implement broadband frequency coverage, thereby further improving flexibility of antenna impedance matching.

Figure 11:
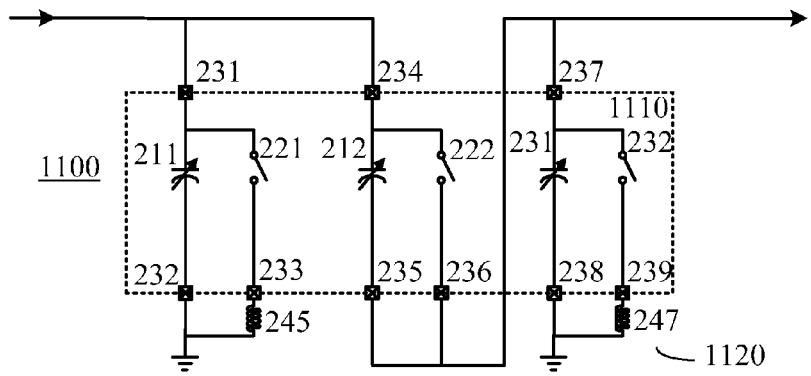
FIG. 11 is a schematic structural diagram of an antenna impedance matching apparatus according to another embodiment of the present invention.

FIG. 11 is a schematic structural diagram of an antenna impedance matching apparatus 1100 according to another embodiment of the present invention. The antenna impedance matching apparatus 1100 includes a semiconductor chip 1110 and at least one impedance component 1120. The semiconductor chip 1110 is similar to the semiconductor chip 210 in FIG. 2, and details are not repeatedly described herein.

According to the embodiment of the present invention, the at least one impedance component 1120 includes: a fifth inductor 245 and a seventh inductor 247, where a first adjustable capacitor 211 is connected to an input terminal of the antenna impedance matching apparatus by using a first terminal 231 of the semiconductor chip and is grounded by using a second terminal 232 of the semiconductor chip, a second adjustable capacitor 212 is connected to the input terminal of the antenna impedance matching apparatus by using a fourth terminal 234 of the semiconductor chip and is connected to an output terminal of the antenna impedance matching apparatus by using a fifth terminal 235 of the semiconductor chip, a third adjustable capacitor 231 is connected to the output terminal of the semiconductor chip by using a seventh terminal 237 of the semiconductor chip and is grounded by using an eighth terminal 238 of the semiconductor chip, a first switch 221 is grounded by using a third terminal 233 of the semiconductor chip and the fifth inductor 245, a second switch 222 is connected to the output terminal of the antenna impedance matching apparatus by using a sixth terminal 236 of the semiconductor chip, a third switch 232 is connected to seventh inductor 247 through the ninth terminal 239 of the semiconductor chip, and multiple adjustable capacitors are adjusted to minimum values to bypass the semiconductor chip when the second switch 222 is closed.

For example, when the first switch and the third switch are open, the second switch is closed, and the first adjustable capacitor and the third adjustable capacitor are set to minimum values, the entire antenna impedance matching apparatus is bypassed.

Figure 12:
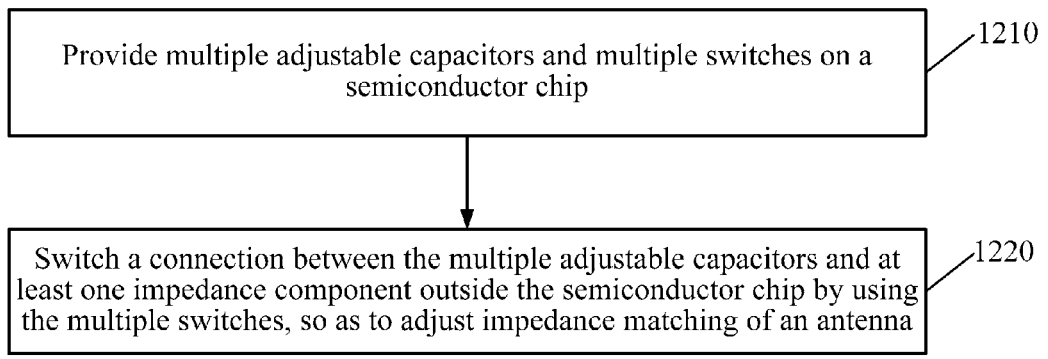
FIG. 12 is a schematic flowchart of an antenna impedance matching method according to an embodiment of the present invention.

FIG. 12 is a schematic flowchart of an antenna impedance matching method according to an embodiment of the present invention. The antenna impedance matching method in FIG. 12 includes the following content.

1210. Provide multiple adjustable capacitors and multiple switches on a semiconductor chip, where the semiconductor chip is coupled to at least one impedance component through multiple terminals and coupled to an input terminal and an output terminal of an antenna impedance matching apparatus, and the input terminal and the output terminal of the antenna impedance matching apparatus are respectively coupled to a radio frequency circuit and an antenna.

1220. Under control of a control signal, switch a connection between the multiple adjustable capacitors and at least one impedance component outside the semiconductor chip by using the multiple switches, and adjust, by an adjustment signal, values of the multiple adjustable capacitors, so as to tune impedance matching of the antenna.

In the embodiment of the present invention, antenna impedance may be tuned by a semiconductor chip that includes multiple adjustable capacitors and switches and an impedance component outside the semiconductor chip, and different equivalent adjustable impedance ranges are implemented by switching of the switches, which can expand frequency coverage for tuning antenna impedance, thereby flexibly tuning the antenna impedance according to a requirement.

According to the embodiment of the present invention, in 1220, capacitance values of the multiple adjustable capacitors may be configured by using a software interface, and states of the multiple switches may be configured according to the software interface, so as to tune the impedance matching of the antenna.

According to the embodiment of the present invention, in 1220, under the control of the control signal, one of the following may be performed, by using the multiple switches, on the multiple adjustable capacitors and the at least one impedance component: parallel connection, series connection, and bypassing, so as to tune the impedance matching of the antenna.

In the embodiment of the present invention, a switch that is connected in parallel to an adjustable capacitor may be disposed inside a semiconductor chip, so as to switch fixed inductors of different values outside the semiconductor chip, where an equivalent effect is that a capacitance/inductance value of an antenna impedance matching apparatus is adjustable, and may also be used to switch fixed capacitors of different values outside the semiconductor chip, where an equivalent effect is that an adjustable capacitance range of an antenna tuner is extended. In this way, by switching different board-level impedance components by using the switch, a tuning frequency range of the antenna tuner can be extended, thereby meeting a requirement for broadband frequency coverage.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not repeatedly described herein.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the apparatuses or units may be electrical, mechanical, or in another form.

The units described as separate parts may or may not be physically separated, and parts shown as units may or may not be physical units, that is, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An antenna impedance matching apparatus, comprising:
   a semiconductor chip, comprising multiple adjustable capacitors and multiple switches, wherein each adjustable capacitor of the multiple adjustable capacitors is arranged in parallel with an individual switch of the multiple switches thereby forming multiple capacitor-switch pairs; and
   at least one impedance component, located outside the semiconductor chip, wherein the semiconductor chip is coupled to the at least one impedance component through multiple terminals and coupled to an input terminal and an output terminal of the antenna impedance matching apparatus; the input terminal and the output terminal of the antenna impedance matching apparatus are respectively coupled to a radio frequency circuit and an antenna;
   wherein the multiple switches are configured to, under control of a control signal, switch a connection between the multiple adjustable capacitors and the at least one impedance component; and wherein capacitance values of the multiple adjustable capacitors are adjusted by an adjustment signal, so as to tune impedance matching of the antenna,
   wherein the multiple adjustable capacitors comprise a first adjustable capacitor and a second adjustable capacitor, and the multiple switches comprise a first switch and a second switch, wherein a first terminal and a second terminal of the first adjustable capacitor are respectively connected to a first terminal and a second terminal of the semiconductor chip, a first terminal and a second terminal of the second adjustable capacitor are respectively connected to a fourth terminal and a fifth terminal of the semiconductor chip, a first terminal and a second terminal of the first switch are respectively connected to the first terminal and a third terminal of the semiconductor chip, and a first terminal and a second terminal of the second switch are respectively connected to the fourth terminal and a sixth terminal of the semiconductor chip.

2. The antenna impedance matching apparatus according to claim 1, wherein the multiple switches are configured to: when the multiple switches are in an open state or a closed state, implement at least one of the following connection schemes on the multiple adjustable capacitors and the at least one impedance component: a parallel connection scheme, a series connection scheme, and a bypass scheme, so as to tune the impedance matching of the antenna.

3. The antenna impedance matching apparatus according to claim 1, wherein the semiconductor chip comprises a control circuit, configured to generate the control signal and the adjustment signal.

4. The antenna impedance matching apparatus according to claim 1, wherein the at least one impedance component comprises: a first inductor, a second inductor, a first capacitor, and a second capacitor, wherein the antenna impedance matching apparatus is an L-type impedance matching network, the first adjustable capacitor is connected to the input terminal of the antenna impedance matching apparatus through the first terminal of the semiconductor chip and the first inductor, the first adjustable capacitor is connected to the output terminal of the antenna impedance matching apparatus through the second terminal of the semiconductor chip, the second adjustable capacitor is connected to the output terminal of the antenna impedance matching apparatus through the fourth terminal of the semiconductor chip and is grounded through the fifth terminal of the semiconductor chip, the output terminal of the antenna impedance matching apparatus is grounded through the second inductor, the first switch is connected to the output terminal of the antenna impedance matching apparatus through the third terminal of the semiconductor chip and the first capacitor, so that the first adjustable capacitor is connected in parallel to the first capacitor when the first switch is closed, and the second switch is grounded through the sixth terminal of the semiconductor chip and the second capacitor, so that the second adjustable capacitor is connected in parallel to the second capacitor when the second switch is closed.

5. The antenna impedance matching apparatus according to claim 1, wherein the at least one adjustable capacitor further comprises a third adjustable capacitor, and the multiple switches further comprise a third switch, wherein a first terminal and a second terminal of the third adjustable capacitor are respectively connected to a seventh terminal and an eighth terminal of the semiconductor chip, and a first terminal and a second terminal of the third switch are respectively connected to the seventh terminal and a ninth terminal of the semiconductor chip.

6. The antenna impedance matching apparatus according to claim 5, wherein the impedance matching apparatus is a PI-type impedance matching network, and the at least one impedance component comprises: a second inductor, a third inductor, and a fourth inductor, wherein the first adjustable capacitor is connected to the input terminal of the antenna impedance matching apparatus through the first terminal of the semiconductor chip and is grounded through the second terminal of the semiconductor chip, the second adjustable capacitor is connected to the input terminal of the antenna impedance matching apparatus through the fourth terminal of the semiconductor chip and the fourth inductor and is connected to the output terminal of the antenna impedance matching apparatus through the fifth terminal of the semiconductor chip, the third adjustable capacitor is connected to the output terminal of the antenna impedance matching apparatus through the seventh terminal of the semiconductor chip and is grounded through the eighth terminal, the input terminal of the antenna impedance matching apparatus is grounded through the third inductor, and the output terminal of the antenna impedance matching apparatus is grounded through the second inductor.

7. The antenna impedance matching apparatus according to claim 6, wherein the at least one impedance component further comprises: a fifth inductor, a sixth inductor, and a seventh inductor, wherein the first switch is grounded through the third terminal of the semiconductor chip and the fifth inductor, so that the third inductor is connected in parallel to the fifth inductor, the second switch is connected in series to the sixth inductor through the sixth terminal of the semiconductor chip, so that the fourth inductor is connected in parallel to the sixth inductor, and the third switch is grounded through the ninth terminal of the semiconductor chip and the seventh inductor, so that the second inductor is connected in parallel to the seventh inductor.

8. The antenna impedance matching apparatus according to claim 5, wherein the impedance matching apparatus is a PI-type impedance matching network, and the at least one impedance component comprises: a second inductor, a third inductor, and a fourth inductor, wherein the first adjustable capacitor is connected to the input terminal of the antenna impedance matching apparatus through the first terminal of the semiconductor chip and is grounded through the second terminal of the semiconductor chip, the second adjustable capacitor is connected to the input terminal of the antenna impedance matching apparatus through the fourth terminal of the semiconductor chip and is connected to the output terminal of the antenna impedance matching apparatus through the fifth terminal of the semiconductor chip and the fourth inductor, the third adjustable capacitor is connected to the output terminal of the antenna impedance matching apparatus through the seventh terminal of the semiconductor chip and is grounded through the eighth terminal, the input terminal of the antenna impedance matching apparatus is grounded through the third inductor, and the output terminal of the antenna impedance matching apparatus is grounded through the second inductor.

9. The antenna impedance matching apparatus according to claim 5, wherein the at least one impedance component further comprises a fourth inductor, the antenna impedance matching apparatus is an LC-type impedance matching network, and one of the multiple adjustable capacitors and the fourth inductor are connected in series between the output terminal and the input terminal of the antenna impedance matching apparatus.

10. The antenna impedance matching apparatus according to claim 9, wherein the at least one impedance component further comprises: a fifth inductor and a third capacitor, wherein the first adjustable capacitor is connected to the input terminal of the antenna impedance matching apparatus through the first terminal of the semiconductor chip and the fourth inductor and is grounded through the second terminal of the semiconductor chip, the second adjustable capacitor is connected to the input terminal of the antenna impedance matching apparatus through the fourth terminal of the semiconductor chip and the fourth inductor, the first switch is grounded through the third terminal of the semiconductor chip and the fifth inductor, and the second switch is grounded through the sixth terminal of the semiconductor chip and the third capacitor.

11. The antenna impedance matching apparatus according to claim 5, wherein the impedance matching apparatus is a double PI-type impedance matching network, and the at least one impedance component comprises: a second inductor, a third inductor, a fourth inductor, and an eighth inductor, wherein the first adjustable capacitor is connected to the input terminal of the antenna impedance matching apparatus through the first terminal of the semiconductor chip, is grounded through the second terminal of the semiconductor chip, and is connected to the fourth terminal of the semiconductor chip through the first terminal of the semiconductor chip and the fourth inductor, the second adjustable capacitor is connected to the output terminal of the antenna impedance matching apparatus through the fourth terminal of the semiconductor chip and the eighth inductor and is grounded through the fifth terminal of the semiconductor chip, the third adjustable capacitor is connected to the output terminal of the antenna impedance matching apparatus through the seventh terminal of the semiconductor chip and is grounded through the eighth terminal, the input terminal of the antenna impedance matching apparatus is grounded through the third inductor, and the output terminal of the antenna impedance matching apparatus is grounded through the second inductor.

12. The antenna impedance matching apparatus according to claim 11, wherein the at least one impedance component further comprises: a ninth inductor, a tenth inductor, and an eleventh inductor, wherein the ninth inductor is connected between the fourth inductor and the fourth terminal of the semiconductor chip; the first switch is connected to the fourth inductor and the ninth inductor through the third terminal of the semiconductor chip, so as to bypass the fourth inductor when the first switch is closed; the tenth inductor is connected between the eighth inductor and the seventh terminal of the semiconductor chip; the third switch is connected to the eighth inductor and the tenth inductor through the ninth terminal of the semiconductor chip, so as to bypass the tenth inductor when the third switch is closed; and the second switch is grounded through the sixth terminal of the semiconductor chip and the eleventh inductor.

13. The antenna impedance matching apparatus according to claim 5, wherein the at least one impedance component further comprises: a fifth inductor and a seventh inductor, wherein the first adjustable capacitor is connected to the input terminal of the antenna impedance matching apparatus through the first terminal of the semiconductor chip and is grounded through the second terminal of the semiconductor chip, the second adjustable capacitor is connected to the input terminal of the antenna impedance matching apparatus through the fourth terminal of the semiconductor chip and is connected to the output terminal of the antenna impedance matching apparatus through the fifth terminal of the semiconductor chip, the third adjustable capacitor is connected to the output terminal of the semiconductor chip through the seventh terminal of the semiconductor chip and is grounded through the eighth terminal of the semiconductor chip, the first switch is grounded through the third terminal of the semiconductor chip and the fifth inductor, the second switch is connected to the output terminal of the antenna impedance matching apparatus through the sixth terminal of the semiconductor chip, the third switch is connected to the seventh inductor through the ninth terminal of the semiconductor chip, and the multiple adjustable capacitors are adjusted to minimum values to bypass the semiconductor chip when the second switch is closed.

14. The antenna impedance matching apparatus according to claim 1, wherein the at least one impedance component and the semiconductor chip are located on a printed circuit board (PCB).

15. The antenna impedance matching apparatus according to claim 1, wherein the semiconductor chip and the at least one impedance component are located on a base board and integrated in a single package.

16. The antenna impedance matching apparatus according to claim 1, further comprising:
  a configuration module, coupled to the semiconductor chip; the configuration module configured to generate the control signal and the adjustment signal, and send the generated control signal and adjustment signal to the semiconductor chip using a software interface, so as to configure the capacitance values of the multiple adjustable capacitors and states of the multiple switches.

17. A semiconductor chip, configured to adjust impedance matching of an antenna, the semiconductor chip comprising:
  a control circuit, configured to generate a control signal and an adjustment signal;
  multiple adjustable capacitors;
  multiple switches, configured to, under control of the control signal, switch a connection between the multiple adjustable capacitors and at least one impedance component outside the semiconductor chip, wherein capacitance values of the multiple adjustable capacitors are adjusted by the adjustment signal, so as to tune impedance matching of an antenna that is formed by the semiconductor chip and the at least one impedance component; and
  a plurality of terminals, including a first terminal, a second terminal, a third terminal, a fourth terminal, a fifth terminal and a sixth terminal,
  wherein each adjustable capacitor of the multiple adjustable capacitors is arranged in parallel with an individual switch of the multiple switches thereby forming multiple capacitor-switch pairs, and
  wherein the multiple adjustable capacitors comprise a first adjustable capacitor and a second adjustable capacitor, and the multiple switches comprise a first switch and a second switch, wherein a first terminal and a second terminal of the first adjustable capacitor are respectively connected to the first terminal and the second terminal of the semiconductor chip, a first terminal and a second terminal of the second adjustable capacitor are respectively connected to the fourth terminal and the fifth terminal of the semiconductor chip, a first terminal and a second terminal of the first switch are respectively connected to the first terminal and the third terminal of the semiconductor chip, and a first terminal and a second terminal of the second switch are respectively connected to the fourth terminal and the sixth terminal of the semiconductor chip.

18. The semiconductor chip according to claim 17, wherein the multiple switches are configured to: when the multiple switches are in an open state or a closed state, implement at least one of the following connection schemes on the multiple adjustable capacitors and the at least one impedance component: a parallel connection scheme, a series connection scheme, and a bypass scheme, so as to tune the impedance matching of the antenna.

19. The antenna impedance matching apparatus according to claim 1, wherein the at least one impedance component is arranged in series with the multiple capacitor-switch pairs and in between the multiple capacitor-switch pairs.

20. The semiconductor chip according to claim 17, wherein the at least one impedance component is arranged in series with the multiple capacitor-switch pairs and in between the multiple capacitor-switch pairs.

\* \* \* \* \*